US 6,541,284 B2

(12) United States Patent
Lam

(10) Patent No.: US 6,541,284 B2
(45) Date of Patent: Apr. 1, 2003

(54) INTEGRATED IC CHIP PACKAGE FOR ELECTRONIC IMAGE SENSOR DIE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 48 days.

(21) Appl. No.: 09/943,804

(22) Filed: Aug. 30, 2001

(65) Prior Publication Data

US 2002/0006687 A1 Jan. 17, 2002

Related U.S. Application Data

(62) Division of application No. 09/577,201, filed on May 23, 2000.

(51) Int. Cl.$^7$ ............................................. H01L 27/148
(52) U.S. Cl. ............................................. 438/7; 438/69
(58) Field of Search ............................. 438/64, 65, 69, 438/7, FOR 141, FOR 137; 148/DIG. 162

(56) References Cited

U.S. PATENT DOCUMENTS

| | | | |
|---|---|---|---|
| 5,087,964 A | 2/1992 | Hatta | 357/74 |
| 5,136,152 A | 8/1992 | Lee | 250/211 |
| 5,270,491 A | 12/1993 | Carnall, Jr. et al. | 174/52.4 |
| 5,321,204 A | 6/1994 | Ko | 174/52.4 |
| 5,340,420 A | 8/1994 | Ozimek et al. | 156/64 |
| 5,352,852 A | 10/1994 | Chun | 174/52.4 |
| 5,366,573 A | 11/1994 | Bayer et al. | 156/64 |
| 5,403,773 A * | 4/1995 | Nitta et al. | 438/7 |
| 5,529,936 A | 6/1996 | Rostoker | 437/2 |
| 5,534,725 A | 7/1996 | Hur | 257/434 |
| 5,666,569 A | 9/1997 | Fullam et al. | 396/101 |
| 5,675,685 A * | 10/1997 | Fukuda et al. | 385/89 |
| 5,753,857 A | 5/1998 | Choi | 174/52.4 |
| 5,773,323 A | 6/1998 | Hur | 438/123 |
| 5,783,815 A * | 7/1998 | Ikeda | 250/208.1 |
| 5,821,532 A | 10/1998 | Beaman et al. | 250/239 |
| 5,998,878 A | 12/1999 | Johnson | 257/797 |
| 6,037,655 A | 3/2000 | Philbrick et al. | 257/680 |
| 6,067,025 A * | 5/2000 | Chiu et al. | 340/686.5 |
| 6,072,232 A | 6/2000 | Li et al. | 257/680 |
| 6,150,653 A | 11/2000 | Assadi et al. | 250/216 |
| 6,271,049 B1 * | 8/2001 | Auracher et al. | 438/29 |

* cited by examiner

Primary Examiner—George Fourson
(74) Attorney, Agent, or Firm—Thomas Schneck

(57) ABSTRACT

An IC chip package for an image sensitive, integrated circuit semiconductor die incorporates all the components typically found in an imaging module of an electronic camera. The IC chip package consists of a plastic substrate base for holding an image sensor die and a separate, plastic upper cover for encapsulating the image sensor die and holding a filter glass, an optical lens, and providing an aperture for the optical lens. The upper cover has a lower shelf for holding the optical lens in alignment with the aperture opening over the image sensor die, and has an upper shelf for holding the filter glass over the optical lens. The lens is attached to the lower shelf using UV cure adhesive, and its focal distance to the image sensor die is determined by first electrically activating the image sensor die, adjusting the lens position to identify the optimal focus sharpness, and then applying UV light to activate the UV cure adhesive and hold the lens in focus.

18 Claims, 7 Drawing Sheets

INTEGRATED IC CHIP PACKAGE FOR ELECTRONIC IMAGE SENSOR DIE

CROSS-REFERENCE TO RELATED APPLICATION

This is a divisional of application Ser. No. 09/577,201 filed May 23, 2000.

FIELD OF THE INVENTION

The invention relates generally to the field of image sensing IC chip packages and methods of making same.

BACKGROUND OF THE INVENTION

An image sensing integrated circuit chip 23, shown in FIG. 1, is at the center of all electronic, i.e. digital, cameras. Typically, IC chip package 23 is ceramic and has a glass window 25 covering an image sensitive integrated circuit die 29. As it is known in the art, image sensitive circuit die 29 may include an array of light sensitive charge coupled devices that produce an electronic image when exposed to light. Glass window 25 is part of a standard "cover" or "lid" for the IC chip 23 and has the sole function of providing a hermetic seal to protect circuit die 29 from the environment while permitting it to be exposed to light. Image sensing IC chip package 23, however, is only a small part of an electronic camera.

With reference to FIG. 2, the imaging module 9 of a typical electronic camera incorporates several components and sub-components. The components are assembled into a carrier package for the individual sub-components. FIG. 2 provides a cut-out view of a typical image module assembly, or carrier package, 9. As shown, carrier package 9 includes a lens assembly 11, a mounting plate 15 and a ceramic, IC chip package 19 housing a solid state image sensitive die 22. As explained above, ceramic chip 19 has a glass window 21 over the image sensitive die 22. The cavity 13 of lens assembly 11 typically includes such elements as an aperture, an optical lens, and an IR filter. A recessed barrel 11b of lens assembly 11 would be fitted into an opening in mounting plate 15, which in turn would have multiple reference locators 17 for mating with concentric mounting holes 24 in ceramic chip package 19. The assembly of carrier package 9 is further complicated by the requirement that the optical lens be kept at a critical "focal distance" to the surface of the image sensitive die 22. A further discussion on some of the difficulties associated with construction of such imaging modules can be found in U.S. Pat. No. 5,998,878.

In addition to the complexity of imaging module 9, the image sensing IC chip package 19 can place additional obstacles to the construction of an electronic camera. As explained above, IC chip package 19 is typically ceramic, which makes it considerably more expensive than other IC chip packages. Attempts to reduce the cost of packaging an image sensitive die has lead to the use of plastic chip packages in electronic cameras.

FIG. 3 shows an example of a plastic chip package 31 for housing an image sensitive die 33 discussed in U.S. Pat. No. 5,534,745. Image sensitive die 33 is attached to a substrate paddle 35. As it would be understood in the art, the light sensitive charge coupled devices, CCD, would be arranged in an array pattern in the middle of the surface of die 33. For illustrative purposes, the side-view of the section of die 33 representing the CCD array is shown as a rectangular shape 39 along the top surface of die 33. In the present example, a film wall 41 of polyamide having adhesive on both its upper and lower sides is placed surrounding the image sensitive area 39 of die 33. A glass cover 43 is then attached onto the film wall 41 over the image sensitive area 39 of die 33. Wire leads 37 are then bonded to the bond pads on die 33. Finally, the entire assembly is encased in a molding step to form plastic package 31.

A second approach to produce a plastic chip package for an image sensitive die is discussed in U.S. Pat. No. 5,753,857. With reference to FIG. 4, an IC chip package 51 in accordance with the '857 patent consists of two interlocking, plastic components; a support-base component 53 and a lid component 55. The image sensitive die 57 is attached to base component 53. The lid component 55 includes solder bumps 59 coupled to wire leads 61. As the lid component 55 is coupled to the support-base component 53, the solder bumps 59 line up with the bond pads on image sensitive die 57. The lid component 55 also has an opening on top exposing the CCD array 58 of die 57. Once the lid component 55 and support-base component 53 have been assembled, a glass top 63 is adhered to lid component 55.

None of the preceding examples, however, attempt to simplify the basic imaging module assembly 9 shown in FIG. 2. One approach toward simplifying a imaging module assembly is to incorporate one of the sub-components of the lens assembly into an IC chip package itself. U.S. Pat. No. 5,340,420 is an example of this approach.

With reference to FIG. 5, the approach described in the '420 patent is to incorporate a color separation filter 65 into an image sensitive, IC chip package 67. Image sensitive die 69 is placed within chip package 67 and wire bonds 71 couple bond pads on die 69 to wire leads within chip package 67. Following this, an optical coupling composition 73 is uniformly coated on top of image sensitive die 69. A color separation filter 65 is then placed on composition 73. Filter 65 is pressed down to form uniform spreading of composition 73, and is then aligned using alignment targets, as is known in the art. Once the die 69 and filter 65 assembly has been checked for debris and bubble entrapment, very small amounts of ultraviolet curable adhesive is placed at each end of filter 65 to set it in place. A black epoxy is then dispensed along the periphery of filter 65 to encapsulate the separation interface between filter 65 and die 69. Lastly, a glass cover 75 is placed on IC chip package 67.

In spite of the incorporation of the filter into the IC package, as shown in FIG. 5, one is still required to construct a larger imaging module assembly 9, as shown in FIG. 2, to house all the other necessary sub-components of the lens module 11 and to attach the lens module to the chip package. What is needed is an IC chip package that minimizes the need for construction of a modular imaging assembly.

It is an object of the present invention to provide an imaging module assembly of reduced complexity.

It is a second object of the present invention to reduce the cost associated with the construction of an imaging module assembly.

It is still a third object of the present invention to provide a method of miniaturizing the imaging assembly of an electronic camera.

SUMMARY OF THE INVENTION

The above objects have been met in a one-piece, chip module cover design that integrates all the critical functional elements of the imaging module of an electronic camera. The electronic camera module of the present invention provides reduced piece parts and assembly costs by integration of all the individual sub-components of an imaging module and their respective mounting features into a single cover design for an IC chip package. As a result, the present invention also provides a higher reliability for the overall imaging module assembly of the camera.

The IC chip package of the present invention constitutes a complete imaging module for an electronic camera, and is preferably constructed from injection molded plastic to further reduce cost. A molded plastic cover is first constructed. The molded plastic cover holds an IR filter, holds an optical lens within proper focal distance, provides an aperture function for the optical lens, and provides protection for an image sensitive die, which it covers. Preferably the cover also has a metal coat, such as electroless nickel plating, to provide EMI shielding. The process begins by attaching the image sensitive die, or image sensor die, to a substrate carrier using a die attach epoxy. A wire bond operation is then executed to connect I/O bond pads on the die to substrate carrier bond fingers. A partially assembled, one piece molded chip cover is then attached to the substrate carrier using epoxy. UV cure adhesive is applied to a lens shelf constructed within the molded chip cover. An optical lens is then placed on the lens shelf of the molded chip cover. The focal distance of the lens to the image sensor die is aligned by activating the die and comparing the focus "sharpness". Once the proper focal point is obtained, a UV light source is activated to "cure" the adhesive and hold the lens in focus. A filter glass is then placed on top of the cover. Finally, an epoxy seal process is used to seal the filter glass to the top of the molded cover. This assembly consists of two epoxy joints which has proven to form reliable seals.

Thus, the invention allows fabrication of a miniature camera module for portable electronics like cellular phone, pagers PC cameras etc.

BEST MODE FOR CARRYING OUT THE INVENTION

The presently preferred embodiment envisions a die on a laminated substrate package having a plastic cover, but the material of the package or specific package type is not critical to the invention. The present invention is compatible with existing manufacturing techniques and may be incorporated into various packaging technologies. For example, the present package may be ceramic or plastic and its structure may be applied to leadless chip carriers packages, ball grid array packages, dual-inline packages, and other IC package types known in the art.

Figure 6:
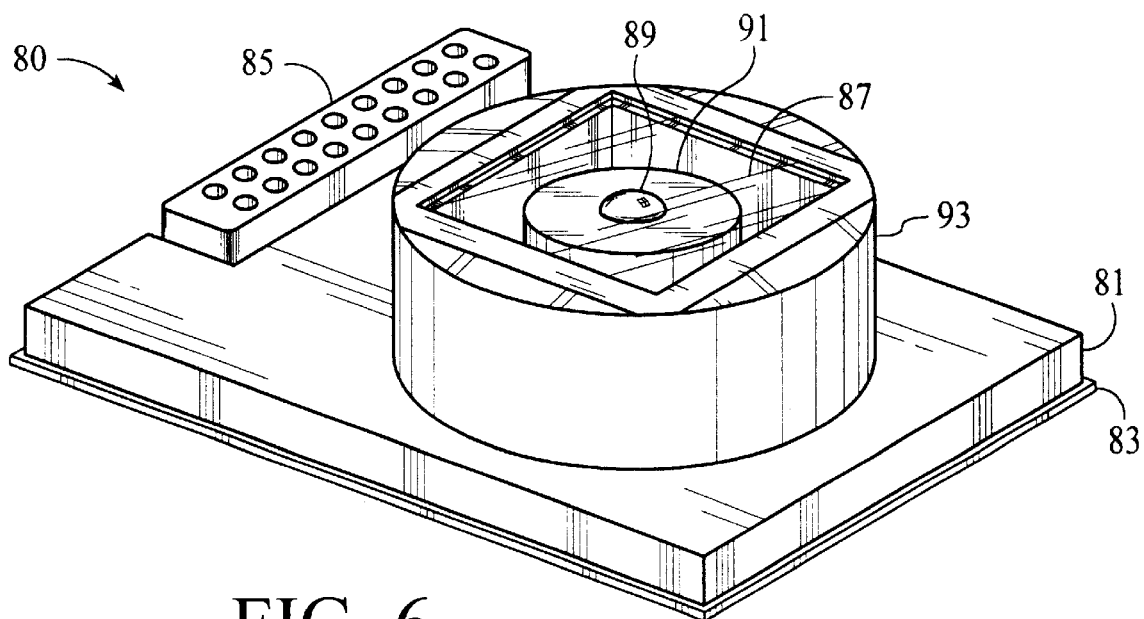
FIG. 6 is a perspective view of an image sensing IC chip package in accord with a first embodiment of the present invention.

With reference to FIG. 6, the present invention is preferably applied to a plastic package modularly so assembled from a cover piece 81 and a substrate base 83. Plastic is preferred since it reduces manufacturing costs and provides an opaque, dark color for the camera chamber. To mitigate heat problems, an image sensor die within package 80 is preferably accessed through a wire socket 85 next to upper cover 81. Other methods known in the art of removing heat from an IC package, such as the use of heat sinks, are likewise applicable to the present invention. Substrate carrier base 83 is preferably a laminated substrate structure, which permits the routing of wire leads along its surface. This facilitates the routing of wire socket 85 to wire leads coupling the image sensor die housed within IC chip package 80. Alternatively, IC chip package 80 may follow more conventional structures providing access to the image sensor die via a ball grid array or lead lines extending out of package 80 rather than using a wire socket. Additionally, package 80 may optionally be given a metal coat, such as electroless nickel plating, to reduce electromagnetic interference, EMI. More critical to the invention, cover 81 holds various imaging components that together with the image sensor die, not shown, constitute a complete imaging module for an electronic camera.

Package cover 81 in accord with the present invention includes a surface opening exposing a cavity topped by a filter glass 87 that provides a dust cover, a hermetic seal, and IR filtering. Within the cavity, an optical lens 89 attached to a frame structure 91 form a lens-and-frame assembly that is optically coupled to an image sensor die through an optical aperture. Frame structure 91 preferably has a ring shape and together with optical lens 89 form the top of a chamber within the cavity for the image sensor die. Optical lens 89 is maintain at a proper focal distance from the image sensor die by an adhesive having a highly controllable curing activation mechanism. Such types of adhesives may have a curing action selectively activated by the presence of a controllable agent or catalyst such as a chemical agent, heat, or energetic short-wave light such as UV light. The curing stage is activated only in the presence of the specific controllable catalyst. In the presently preferred embodiment, the preferred adhesive is UV cure adhesive and it is used in a manner described below. In the presently preferred embodiment, filter glass 87, optical lens 89, and frame 91 are held within a barrel-shaped housing 93, but this is not critical to the invention. It is to be understood that upper cover 81 may have other shapes more conventional in the art.

Figure 1:
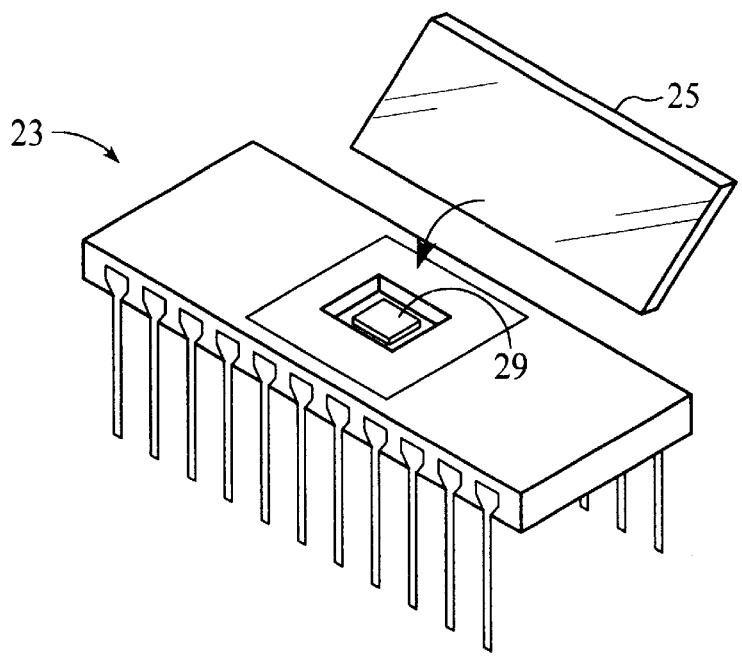
FIG. 1 is a prior art IC chip package for an image sensitive IC die.
Figure 2:
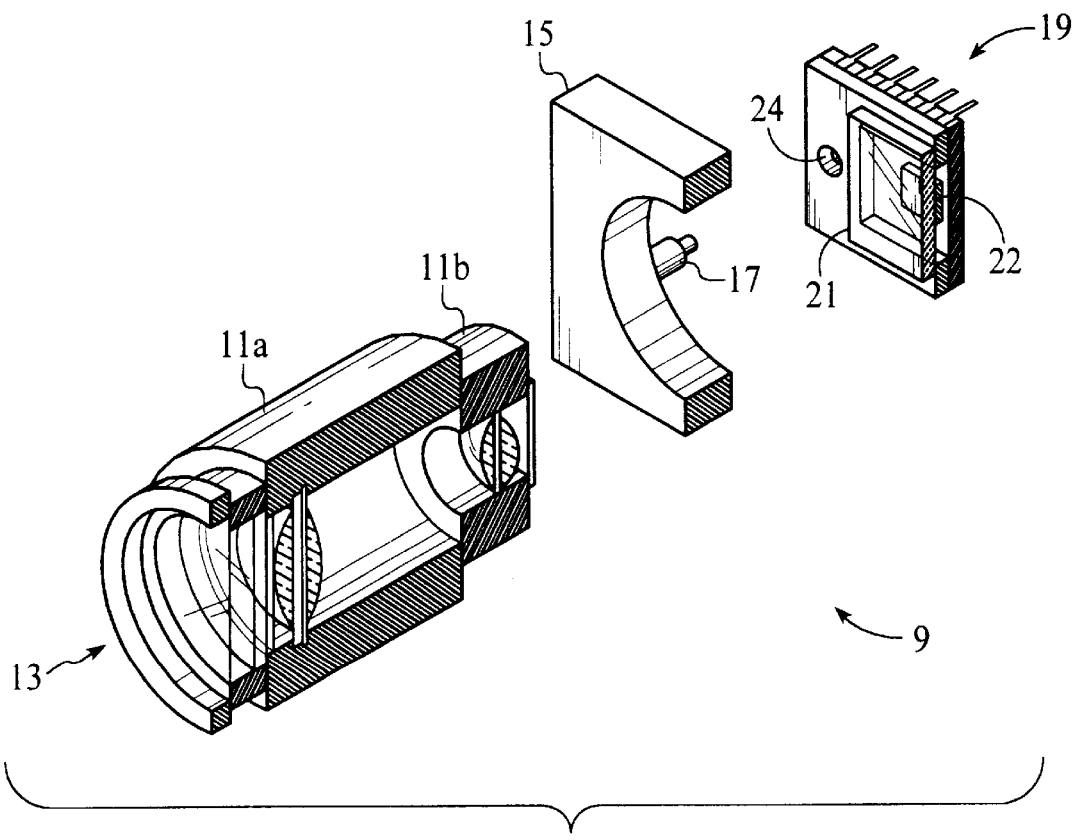
FIG. 2 is a prior art imaging module for use in an electronic camera.
Figure 3:
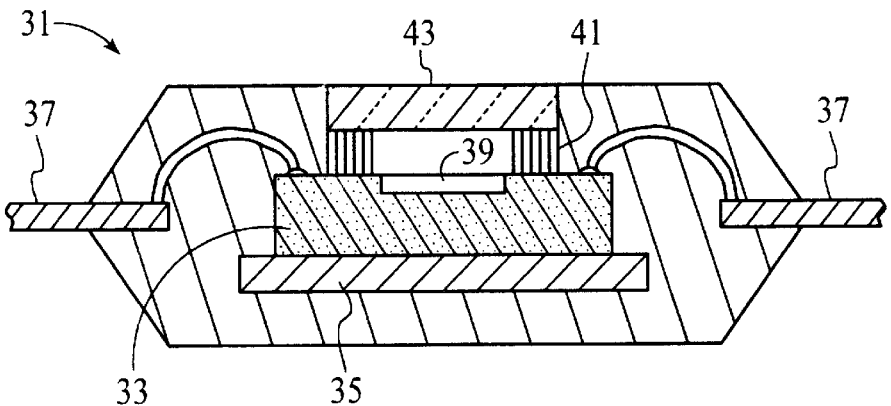
FIG. 3 is a prior art plastic molded IC chip package for an image sensitive IC die.
Figure 4:
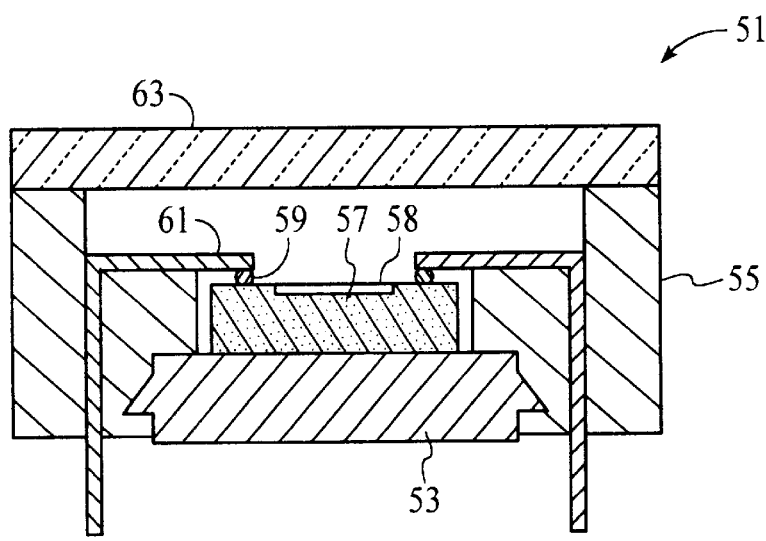
FIG. 4 is a prior art plastic chip package divided into an upper portion and lower portion and suitable for an image sensitive IC die.
Figure 5:
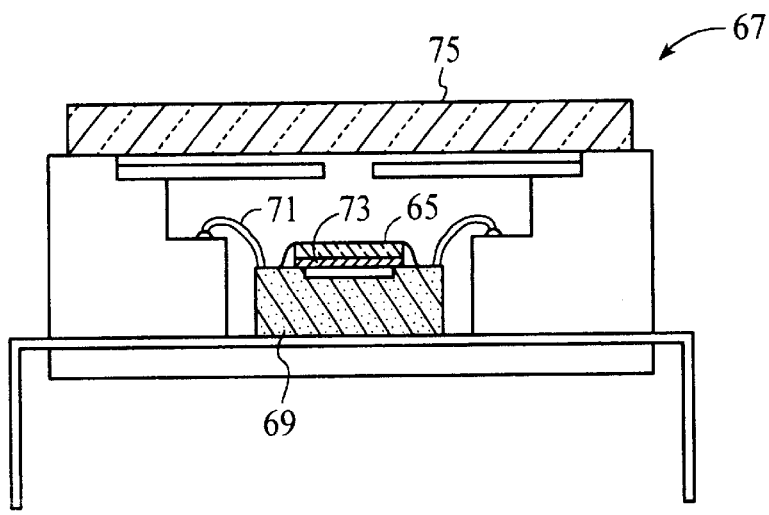
FIG. 5 is a prior art IC chip package incorporating a color filter.
Figure 7:
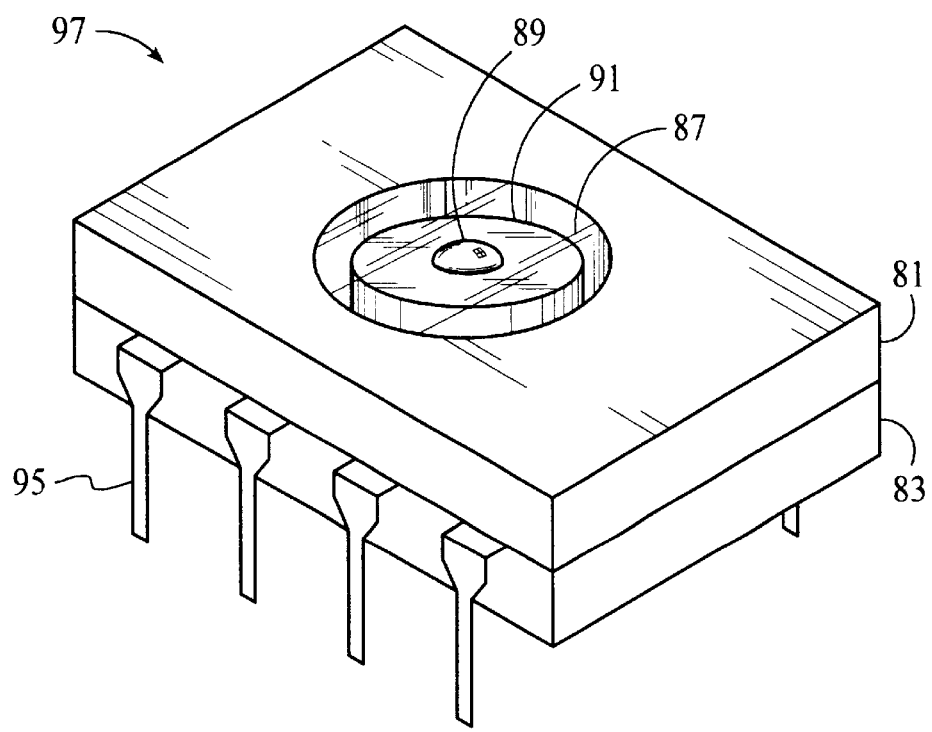
FIG. 7 is a perspective view of an image sensing IC chip package in accord with a second embodiment of the present invention.

With reference to FIG. 7, for example, an alternate embodiment of the present invention is an image sensitive, IC chip package 97 having a more conventional shape similar to that of a dual inline package, DIP. All elements similar to those of FIG. 1 are identified with similar reference characters and are described above. In the present case, wire leads 95 are not encased within a wire socket 85, as shown in FIG. 6, but rather protrude out from the sides of image sensitive IC chip package 80. Additionally, the window opening over optical lens 89 is circular in shape, but a rectangular window opening, such as shown in FIG. 6, is preferred due to compatibility with existing fabrication techniques. In the preferred embodiment, IC chip packages 80 and 97 are constructed from resin molded plastic, but they may alternatively be constructed from ceramic or from other materials known in the art.

Figure 8:
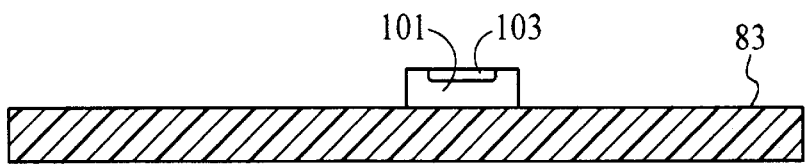
FIG. 8 is a first step in the fabrication of an image sensing IC chip package in accord with the present invention.

With reference to FIG. 8, fabrication of the present image sensitive, IC chip package in accord with the present invention begins by attaching an image sensor die 101 to a substrate carrier base 83 using die attach epoxy. Base 83 is preferable of the laminated substrate type, which facilitates the routing of leads on the surface of base 83. Laminated substrate bases are typically used in multi-chip packages for routing interconnections between multiple dies, but in the present example it is used to facilitate routing between image sensor die 101 and a wire socket 85, such as that shown in FIG. 6. However, neither the use of a laminated substrate base nor a wire socket is critical to the invention, as explained above, carrier base 83 may be of any appropriate material used in the construction of a BGA package, DIP package, LCC package, etc. Returning to FIG. 8, the epoxy is then cured to set image sensor die 101 in place. As it would be understood by those versed in the art, image sensor die 101 may consist of an array of light sensitive charge coupled devices, CCD. As light impacts the array of CCD devices, charge is accumulated at each CCD device in proportion to the intensity of the light. The accumulated charge in the array of CCD devices produces an electronic image of the received light. For illustrative purposes, the area defining the CCD array on image sensor die 101 is represented by a rectangular shape 103 near the top surface.

Figure 9:
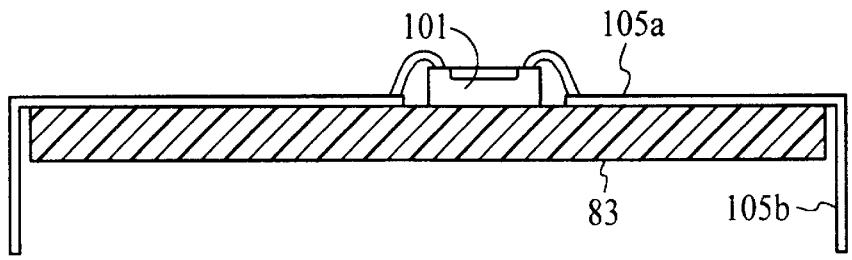
FIG. 9 is a second step in the fabrication of the image sensing IC chip package similar to that of FIG. 7.
Figure 10:
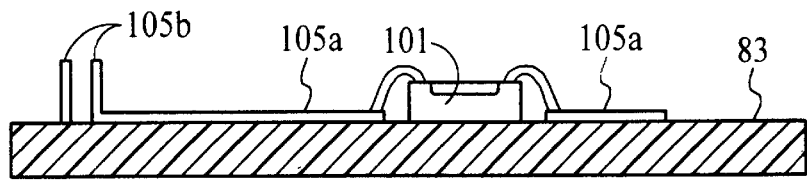
FIG. 10 is a second step in the fabrication of the image sensing IC chip package in accord with that of FIG. 6.

With reference to FIG. 9, a wire bonding operation then connects the communication, I/O, bond pads of sensor die 101 to substrate bond fingers 105a. In the present example, substrate bond fingers 105a are routed beyond substrate carrier base 83 to form wire leads 105b in a manner similar to the package type shown in FIG. 7. The presently preferred package type, however, uses a wire socket 85, as shown in FIG. 6. Therefore, FIG. 10 shows an alternate preferred embodiment wherein substrate bond fingers 105a are routed along the surface of laminated substrate base 83 to form wire leads 105b protruding upward from the surface of substrate carrier base 83. Wire leads 105b are preferably arranged in two rows and mate with a wire socket 85, as indicated in FIG. 6.

Figure 11:
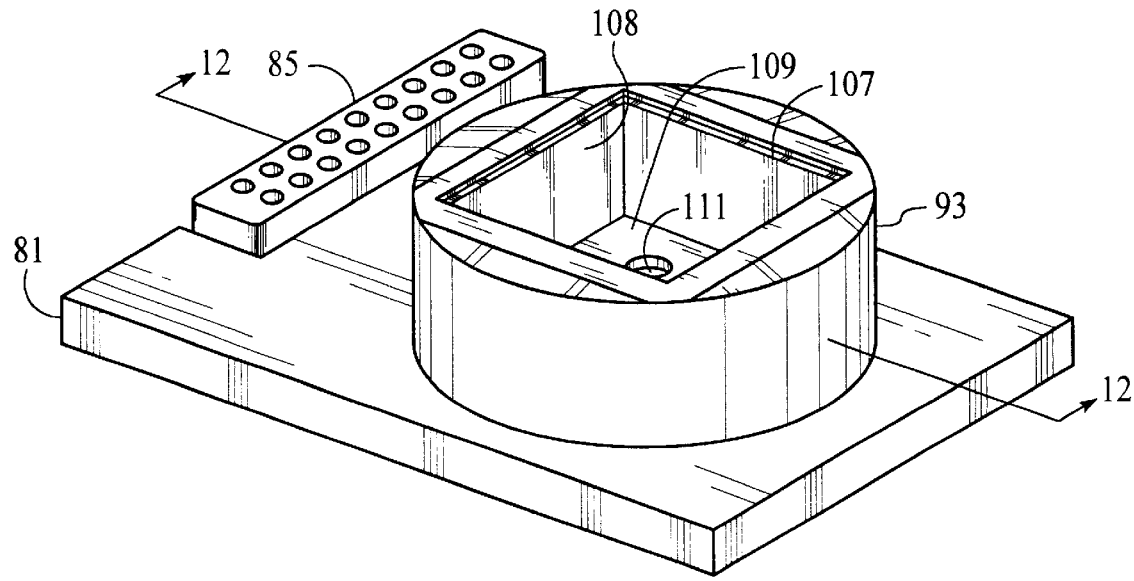
FIG. 11 is a perspective view of an upper cover portion of the IC chip package of FIG. 6.
Figure 12:
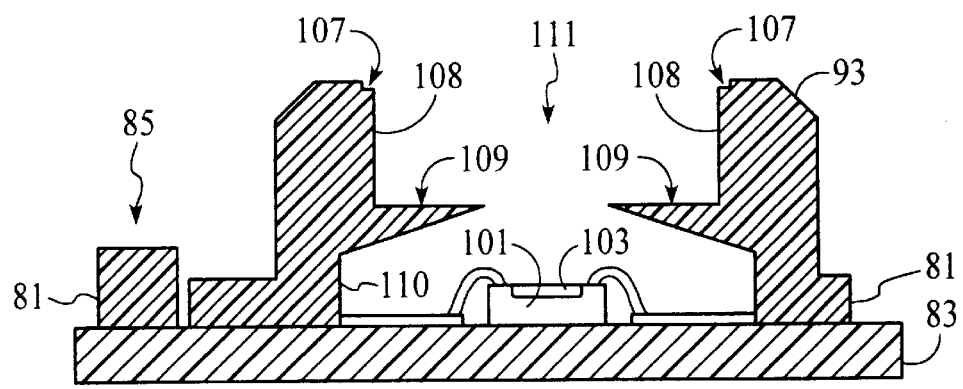
FIG. 12 is a cross-sectional view along lines 12—12 of FIG. 11 and including a substrate base and die.

With reference to FIG. 11, an upper cover 81 designed for use with the structure of FIG. 10 has a surface opening exposing the start of a cavity defined by walls 108. A first shelf 107 along the upper perimeter of the cavity will hold a filter glass, not shown, and a second shelf 109 along the lower perimeter of the cavity will hold an optical lens-and-frame assembly, not shown, below the filter glass. The second shelf, or lens shelf, 109 protrudes inwardly from cavity walls 108 and forms an aperture opening 111 for exposing a chamber in which image sensor die 101 is located. As stated above, wire socket 85 will mate with wire leads 105b of FIG. 10. Wire socket 85 is preferably attached to substrate 83 separately from cover 81 to facilitate manufacture of the present package. Upper cover 81 is attached to substrate base 83 using epoxy, and wire socket 85 is mated with wire leads 105b. Care should be taken to assure that aperture opening 111 is over image sensor die 101. FIG. 12 shows a sectional view of wire socket 85, upper cover 81, and substrate base 83 taken along lines 12—12 after upper cover 81 has been attached to substrate base 83.

With reference to FIG. 12, all elements similar to those of FIGS. 6–11 are given similar reference characters and are defined above. This cut-out view of upper cover 81 more clearly shows the features of the present chip package housing. First shelf 107 will eventually support a filter glass and lens shelf 109 will support an optical lens-and-frame assembly. As shown, image sensor die 101 lies within a cavity chamber formed by substrate base 83, the inner walls 110 of upper cover 81, and the underside of lens shelf 109. In effect, the underside of lens shelf 109 forms the ceiling having a chamber opening formed from the edge of the lens shelf 109 and constituting an aperture opening 111 over the light receiving area 103 of image sensor die 101.

The height of the ledge support provided by lens shelf 109 is preferably selected to provide a gross focal distance from the lens-to-frame assembly to image sensor die 101. Various lens-and-frame assembly structures are suitable for the present invention. It is desirable, however, that the selected lens-and-frame assembly be easily movable within cavity walls 108.

Figure 13:
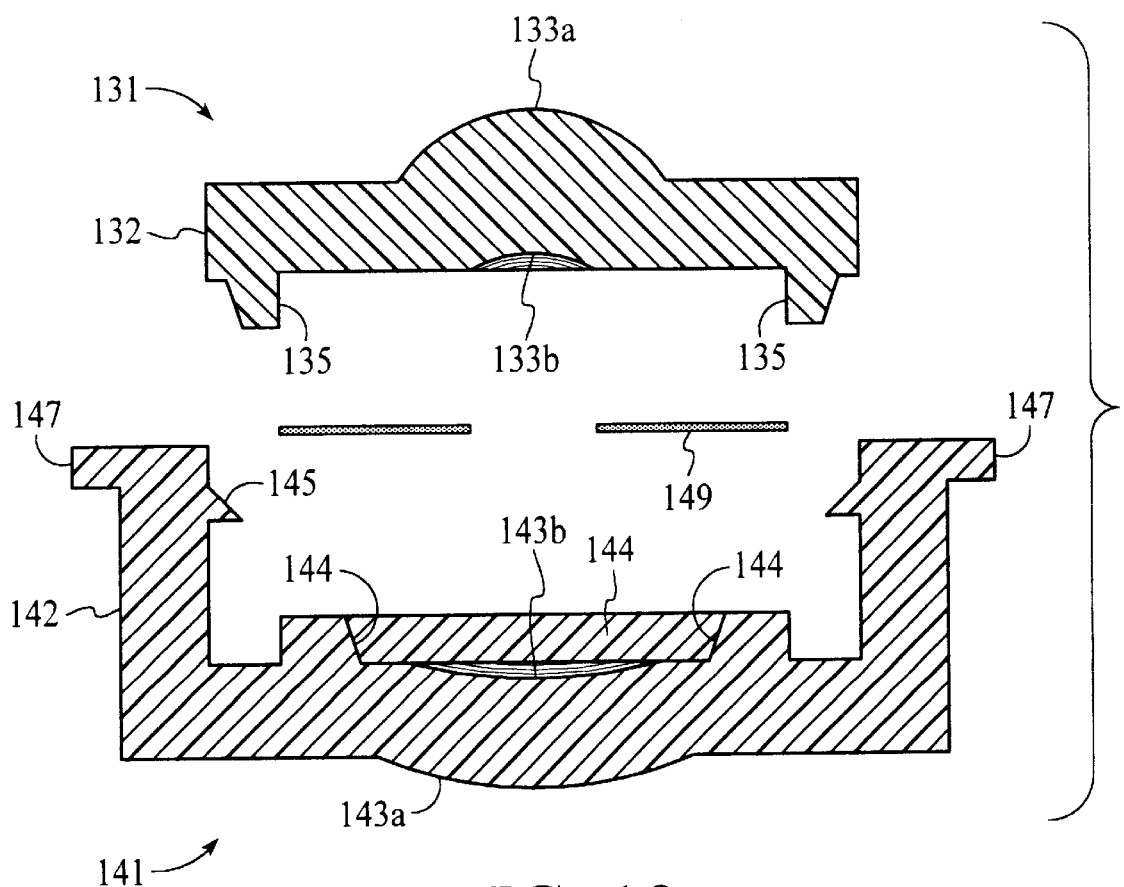
FIG. 13 is a cross-sectional view in the construction for a preferred lens-and-frame assembly in accord with the present invention.

With reference to FIG. 13, construction of a preferred lens-and-frame includes two interlocking pieces 131 and 141. The upper piece 131 includes an upper lens 133 attached to a plastic top support frame 132 having pawl extensions 135. Upper lens 133 is shown to have a convex arch 133a on top and a similar upward arch 133b on its bottom. The lower piece 141 includes a lower lens 143 attached to a plastic base support frame 142 having ratchet mechanism 145 for interlocking with pawl extensions 135 of upper piece 131. Lower lens 143 is shown to have downward arch 143a on its under side and a similar downward arch 143b on its top side. Walls 144 form a space separating the upper 133 and lower 143 lenses, which together function as a composite lens for the presently preferred lens-and-frame assembly. Lower piece 141 preferably includes handling knobs 147 for maneuvering it into place within the cavity of an IC package. An optional second optical aperture is provided by a filter 149 may be inserted between upper and lower pieces 131 and 141. Filter 149, is not necessary since package cover 81 of FIG. 12 already includes a first optical aperture 111.

Figure 14:
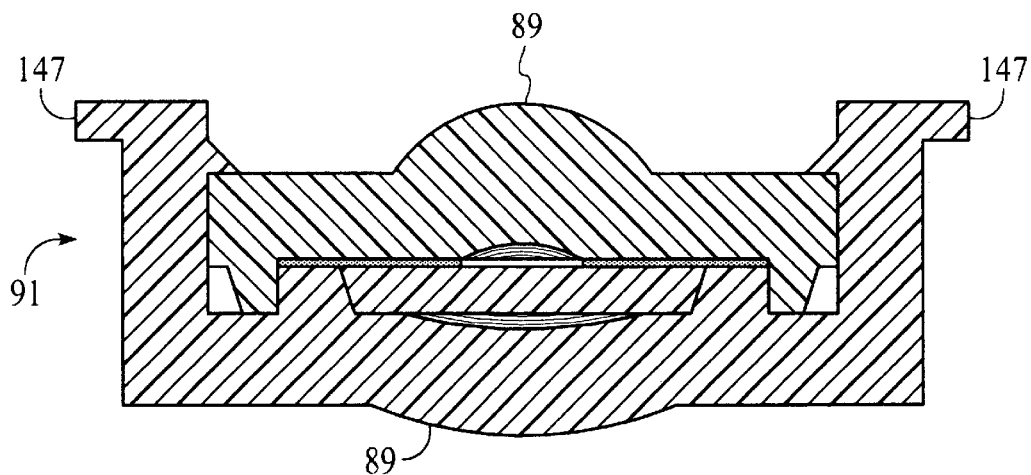
FIG. 14 is a cross-sectional view of a preferred lens-and-frame assembly in accord with the present invention.

FIG. 14 shows a cross-sectional view of the preferred lens-and-package assembly after upper and lower pieces 131 and 141 have been interlocked together. Interlocked upper and lower pieces 131 and 141 together define the final frame structure 91. Similarly, the upper lens 133 and lower lens 143 of FIG. 13 function together to constitute one composite optical lens 89 in FIG. 14. Of particular interest are optional handling knobs 147, which facilitate the handling the final frame structure 91 into the cavity defined by walls 108 of FIG. 12.

Figure 15:
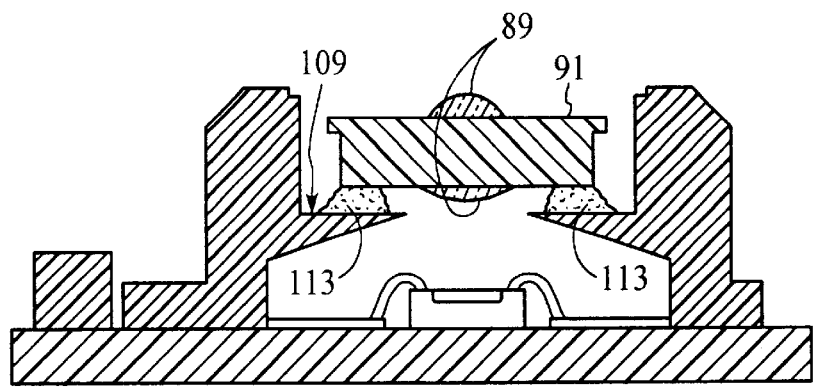
FIG. 15 shows the incorporation of a lens-and-frame assembly into the package of FIG. 12.

With reference to FIG. 15, an adhesive having a highly controllable curing mechanism, such as UV cure adhesive 113 is applied to lens shelf 109. A lens-and-frame assembly consisting of lens 89 and frame 91 is then placed on UV cure adhesive 113. As shown, the lower portion of lens 89 aligns with aperture opening 111 of lens shelf 109. At this point, adhesive 113 has not been cured and lens frame 91 may be freely adjusted.

Figure 16:
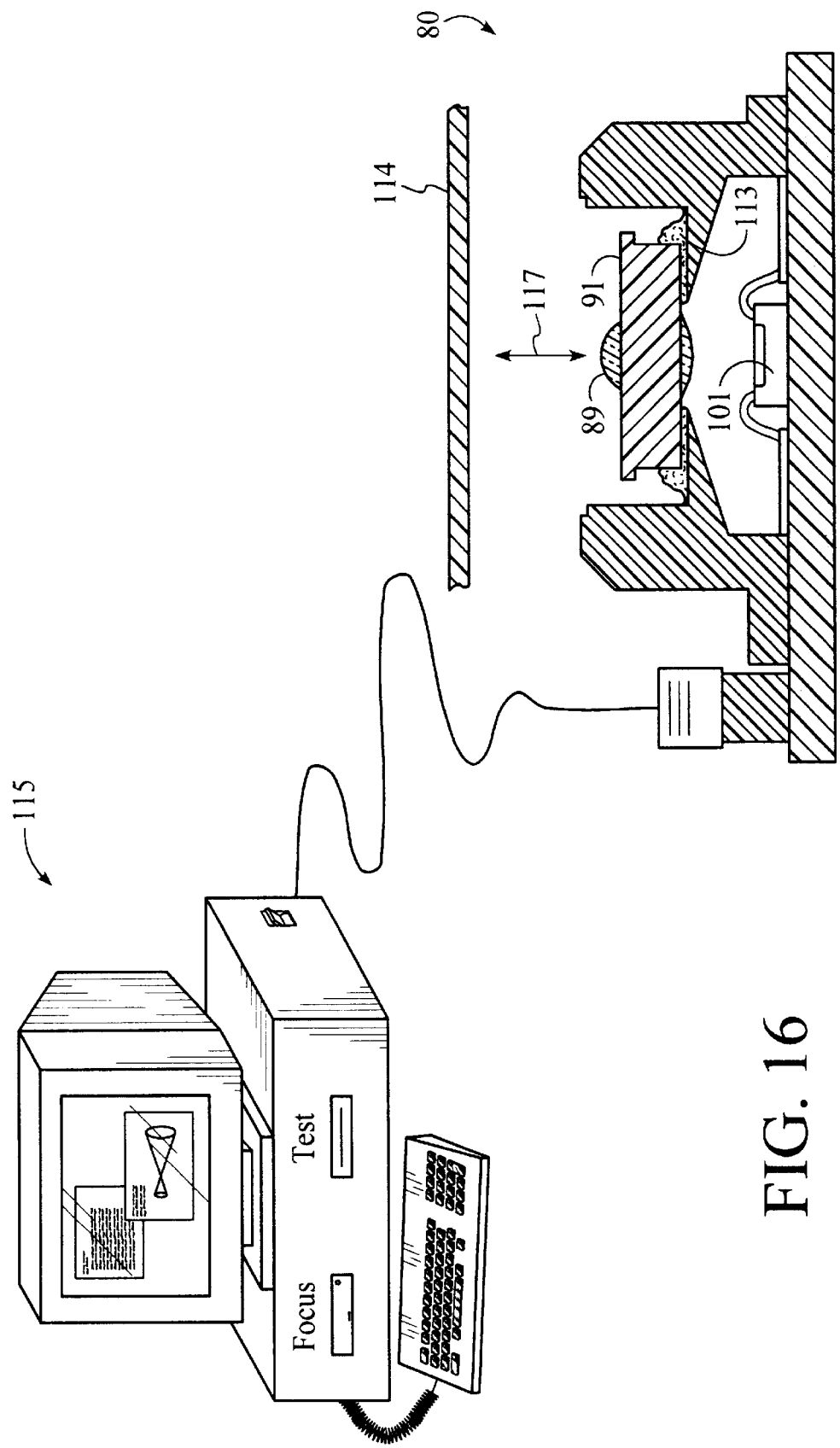
FIG. 16 shows a preferred mechanism for adjusting the focal distance of the lens-and-frame assembly.

With reference to FIG. 16, IC package 80 is then connected to electronic focus testing equipment 115, symbolically represented as a computer, and image sensor die 101 is activated. Since lens frame 91 is free to move, the focal distance of lens 89 to image sensor die 101 may be adjusted to achieve an optimal focus sharpness with respect to a predetermined focal plane 114, as determined by test equipment 115. The movement of lens 89 is illustrated by up-down arrow 117, but it is to be understood that lens 89 may also be adjusted laterally. Once the optimal focal distance and position has been obtained, a source of UV light, not shown, is applied to UV cure adhesive 113, which activates its curing stage and thereby holds lens 89 in focus. As shown, lens 89 will likely protrude through aperture 111 into the chamber where die 101 lies.

Figure 17:
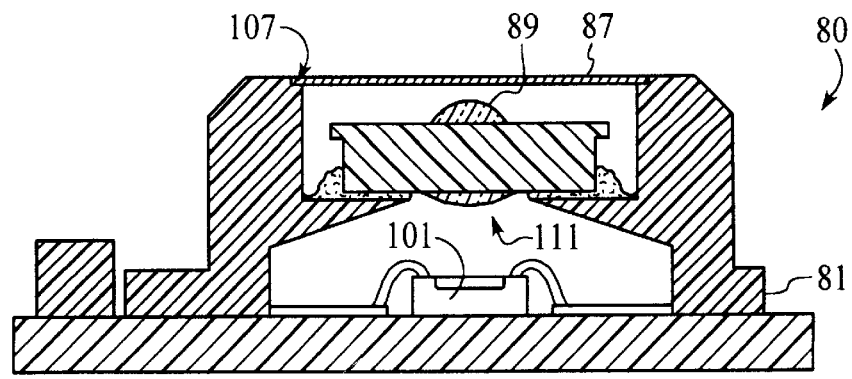
FIG. 17 shows a cross-sectional view of a preferred IC chip package in accord with the present invention.

With reference to FIG. 17, an epoxy seal is then used to attach filter glass 87 to filter shelf 107 of upper cover 81. This assembly consists of two epoxy joints which has proven to form reliable seals. IC chip package 80 therefore incorporates all the sub-components of an electric camera's image module, which in the prior art is held in a separate housing from the IC chip package and constructed into a complicated modular assembly. In other words, the present image sensitive, IC chip package 80 includes an image sensor die 101, a filter 87, an optical lens 89, and an aperture 111 for lens 89.

As stated earlier, IC chip package 80 is preferably a plastic molded package. Therefore, IC chip package 80 is preferably coated with a metal film to provide sensor die 101 with shielding from electromagnetic interference, EMI. Thus, the integrated upper cover 81 of the present invention holds an IR filter in place, holds an optical lens at an optical focal distance through an aperture to a sensor die, and provides environmental and EMI protection to the image sensor silicon die. This permits the fabrication of a miniature camera module for portable electronics like cellular phone, pagers, PC cameras, etc.

What is claimed is:

1. A method of constructing a chip package for an integrated circuit image sensor die comprising the steps of:
    fastening said image sensor die to a base section of said chip package, said chip package further having a first shelf forming an aperture over said image sensor die;
    applying an adhesive having a controllably activated curing stage on said first shelf;
    placing an optical lens on said adhesive such that said optical lens is freely movable;
    electrically coupling said image sensor die to focus testing equipment;
    activating said image sensor die and adjusting the position of said lens to identify its focal distance to a predetermined target plane; and
    activating the curing stage of said adhesive to hold said optical lens in said focal distance.

2. The method of claim 1 wherein said adhesive is UV cure adhesive and said step of activating the curing stage of said adhesive includes applying a source of UV light to said adhesive.

3. The method of claim 1 further including a step of performing a wire bonding operation to connect communication bond pads on said die to bond fingers on said chip package prior to electrically coupling said image sensor die to said focus testing equipment.

4. The method of claim 1 further including the step of attaching a filter glass over said optical lens, said optical lens not being in contact with said filter glass.

5. The method of claim 4 wherein said filter glass is attached in an epoxy seal process.

6. The method of claim 1 further including a step of applying a coating of metal on said chip package.

7. The method of claim 1 wherein said chip package is comprised of modular pieces includes a substrate carrier piece and a cover piece, said substrate carrier piece being said base section of said chip package and said cover piece including said first shelf, the method further defined by attaching said cover piece to said substrate carrier piece prior to activating said image sensor die.

8. The method of claim 7 wherein said cover piece is attached said substrate carrier piece using epoxy.

9. The method of claim 7 further including the step of attaching a filter to the top of said cover piece.

10. The method of claim 7 further including the steps of performing a wire bonding operation to connect input/output bond pads on said die to bond fingers on said chip package prior to electrically coupling said image sensor die to said focus testing equipment and attaching a filter to the top of said cover piece.

11. The method of claim 10 wherein said filter is made of glass and is attached to said cover piece using epoxy.

12. The method of claim 10 further including a step of metal plating said chip package.

13. A method of constructing a chip package for an integrated circuit image sensor die comprising the steps of:
    attaching said image sensor die to a substrate carrier using die attach epoxy;
    attaching a one piece cover to said substrate carrier, said one piece cover having a first shelf for receiving an optical lens;
    applying ultra violet, UV, cure adhesive on said first shelf;
    placing an optical lens assembly on said UV cure adhesive;
    activating said image sensor die and adjusting the position of said optical lens to identify its focal distance to a predetermined target plane; and
    activating a UV light source to cure said UV cure adhesive and hold said optical lens in focus.

14. The method of claim 13 further including a sealing process to seal a filter glass to the top of said upper cover using epoxy.

15. The method of claim 13 further including a step of performing a wire bonding operation to connect input/output bond pads on said image sensor die to bond fingers on said substrate carrier prior to activating said image sensor die.

16. The method of claim 13 wherein said one piece cover is attached to said substrate carrier using epoxy.

17. The method of claim 13 further including the step of metal plating said body.

18. The method of claim 13 wherein said optical lens assembly includes a ring frame with an optical lens traversing its center, said step of placing said optical lens assembly on said UV cure adhesive including the steps of placing said ring frame directly on said UV cure adhesive and not permitting contact of said optical lens with said UV cure adhesive.

* * * * *